(12) United States Patent
Morimura et al.

(10) Patent No.: US 7,440,534 B2
(45) Date of Patent: Oct. 21, 2008

(54) MASTER-SLAVE FLIP-FLOP, TRIGGER FLIP-FLOP AND COUNTER

(75) Inventors: Hiroki Morimura, Kanagawa (JP); Satoshi Shigematsu, Kanagawa (JP); Yukio Okazaki, Kanagawa (JP); Katsuyuki Machida, Kanagawa (JP)

(73) Assignee: Nippon Telegraph and Telephone Corporation, Tokyo (JP)

( * ) Notice: Subject to any disclaimer, the term of this patent is extended or adjusted under 35 U.S.C. 154(b) by 314 days.

(21) Appl. No.: 10/572,446

(22) PCT Filed: Aug. 9, 2005

(86) PCT No.: PCT/JP2005/014579
§ 371 (c)(1),
(2), (4) Date: Mar. 17, 2006

(87) PCT Pub. No.: WO2006/016580
PCT Pub. Date: Feb. 16, 2006

(65) Prior Publication Data
US 2008/0012619 A1    Jan. 17, 2008

(30) Foreign Application Priority Data
Aug. 10, 2004    (JP) .............................. 2004-233223

(51) Int. Cl.
*H03K 23/50*    (2006.01)
*H03K 3/356*    (2006.01)

(52) U.S. Cl. .................. 377/119; 377/121; 327/202; 327/203; 327/208; 327/218

(58) Field of Classification Search .......... 327/202–203
See application file for complete search history.

(56) References Cited

U.S. PATENT DOCUMENTS

| 4,356,411 | A | * | 10/1982 | Suzuki et al. | ............... | 327/203 |
| 5,049,760 | A | * | 9/1991 | Ooms | ......................... | 327/212 |
| 5,384,493 | A | * | 1/1995 | Furuki | ......................... | 327/203 |
| 5,821,791 | A | * | 10/1998 | Gaibotti et al. | ............. | 327/202 |

(Continued)

FOREIGN PATENT DOCUMENTS

JP    60-224319    11/1985

(Continued)

OTHER PUBLICATIONS

Morimura et al., "A Pixel-Level Automatic Calibration Circuit Scheme for Capacitive Fingerprint Sensor LSIs", IEEE Journal of Solid-State Circuits, vol. 37, No. 10, pp. 1302, Oct. 2002.

*Primary Examiner*—Tuan T Lam
(74) *Attorney, Agent, or Firm*—Blakely, Sokoloff, Taylor & Zafman

(57) ABSTRACT

A master latch (1) is formed from a static circuit, and a slave latch (2) is formed from a dynamic circuit. The number of circuit elements can be smaller as compared to a slave latch formed from a static circuit so that the size and area of a master-slave flip-flop can be reduced. Since the master latch is formed from a static circuit, data can be held stably during the standby time by setting the master latch in a data holding state.

5 Claims, 12 Drawing Sheets

U.S. PATENT DOCUMENTS 6,437,624 B1 * 8/2002 Kojima et al. .............. 327/211
7,373,572 B2 * 5/2008 Mak et al. .................. 714/729

FOREIGN PATENT DOCUMENTS

| JP | 9-232920 | 9/1997 |
| JP | 09-270677 A | 10/1997 |
| JP | 2003-188692 | 7/2003 |
| JP | 2003-258607 A | 9/2003 |
| JP | 2004-080172 A | 11/2004 |

* cited by examiner

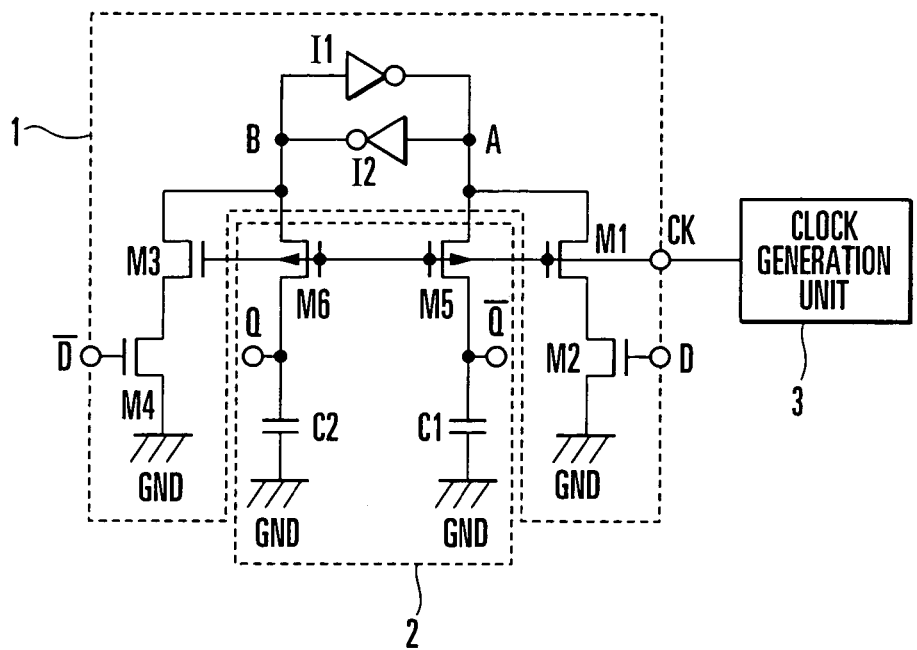
F I G. 1
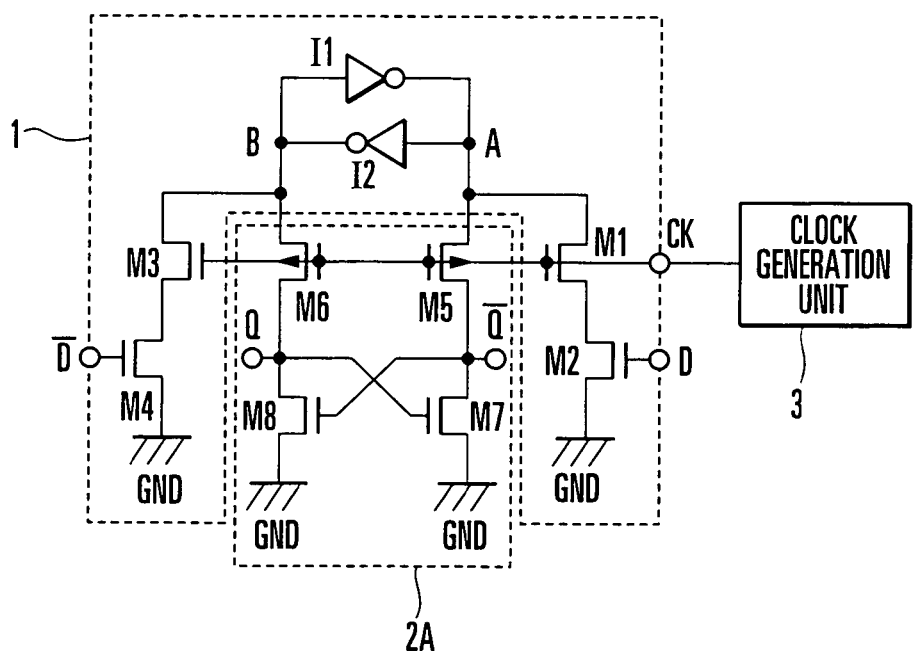
F I G. 2

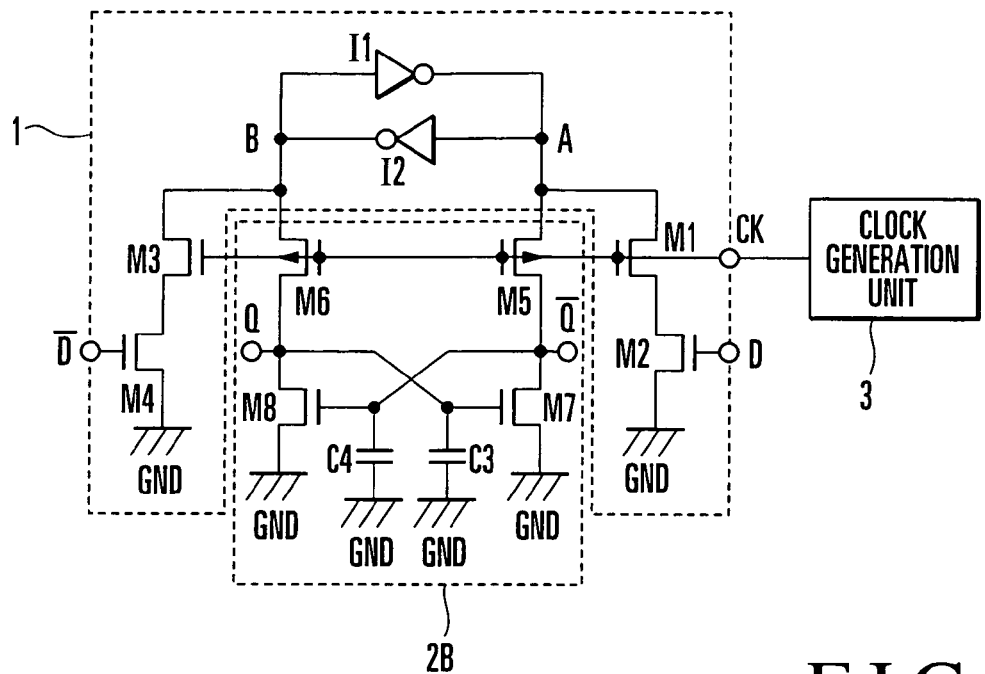
F I G. 3
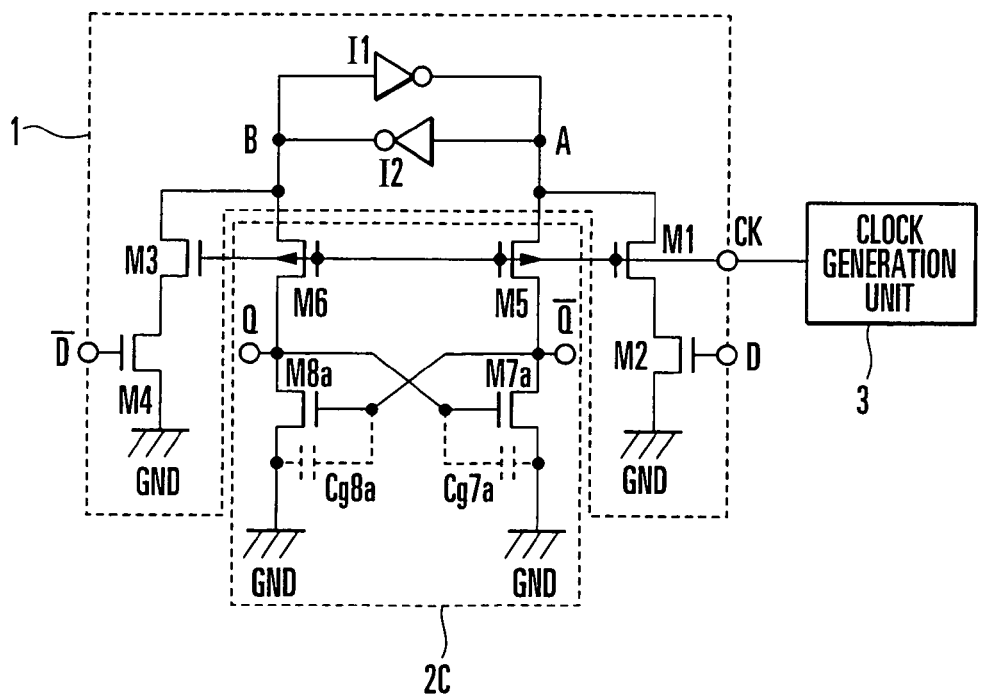
F I G. 4

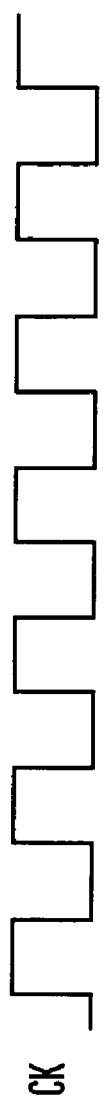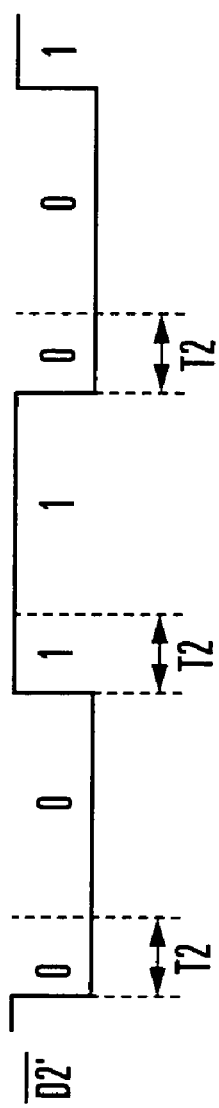
FIG.14A
FIG.14B
FIG.14C
FIG.14D

MASTER-SLAVE FLIP-FLOP, TRIGGER FLIP-FLOP AND COUNTER

The present patent application is a non-provisional application of International Application No. PCT/JP2005/014579, filed Aug. 9, 2005.

1. Technical Field

The present invention relates to a master-slave flip-flop and a trigger flip-flop and counter using the master-slave flip-flop.

2. Background Art

Normally, a master-slave flip-flop and a trigger flip-flop and counter using the master-slave flip-flop use a delay flip-flop (DFF). However, to implement a stable write operation, the DFF has a large transistor size and a large layout area. A technique of reducing the size and area of a master-slave flip-flop or a trigger flip-flop and counter using the master-slave flip-flop by using RAM latches has been proposed.

FIG. 15 is a circuit diagram showing a structure example of a conventional master-slave flip-flop which reduces the size and area by using RAM latches.

The master-slave flip-flop includes a master latch 101 and a slave latch 102. Each of the latches 101 and 102 uses a RAM latch. Each RAM latch includes two inverter circuits and four NMOS transistors. The RAM latch is a static circuit. The same structure as a static RAM (SRAM) memory cell is used so that the transistor size can be minimized, and the size and area can be reduced while implementing a stable write operation. In the master-slave flip-flop shown in FIG. 15, signals input to input terminals D and /D are written and transferred to the master latch 101 and slave latch 102 in synchronism with clock signals CK and /CK and output to output terminals Q and /Q. Note that /D indicates an inverted signal of D, and this also applies to the remaining signals.

FIG. 16 is a circuit diagram showing the structure of a conventional trigger flip-flop and counter using the master-slave flip-flop shown in FIG. 15.

In the trigger flip-flop, an inverted signal of an output signal from itself is received as an input signal to detect the leading edge or trailing edge (trigger) of a clock signal so that the output changes. A trigger flip-flop TFF101 shown in FIG. 16 can be implemented by connecting the output terminals Q and /Q of the master-slave flip-flop shown in FIG. 15 to the input terminals /D and D, respectively.

The trigger flip-flop is regarded as a binary pulse counter because the output returns to the original state upon receiving a clock pulse twice. Hence, when n stages of trigger flip-flops are cascade-connected, a $2^n$-ary counter to count the number of leading edges or trailing edges of clock signals can be formed (n is an integer: $n \geq 2$). The counter shown in FIG. 16 can be implemented by connecting the trigger flip-flop to the clock signal terminal of the trigger flip-flop of the next stage.

FIGS. 17A to 17D are timing charts for explaining the operation of the counter shown in FIG. 16. Referring to FIGS. 17A to 17D, a period $T_A$ indicates the operation time of the counter, and a period $T_B$ indicates the standby time of the counter.

Let Q1 be the output terminal of the first stage (TFF101) of the counter, Q2 be the output terminal of the second stage (TFF101), ..., and Qn be the output terminal of the nth stage (TFF10n).

First, all the output terminals Q1 to Qn output Low level corresponding to "0". During the operation time $T_A$, the clock signal CK changes. When one period T elapses, the output from the output terminal Q1 of the first stage changes from Low level to High level, and the count value is incremented by one (FIG. 17B). When the clock signal CK further changes, and the period T elapses, the output from the output terminal Q1 of the first stage returns from High level to Low level (FIG. 17B). As a result, the output from the output terminal Q2 of the second stage changes from Low level to High level (FIG. 17B), and the count value is incremented by one (FIG. 17C). The count operation can be implemented by repeating this operation.

During the standby time $T_B$, the clock signal CK is fixed to Low level, and the output level of each stage of the counter is held (e.g., reference 1 (IEEE JOURNAL OF SOLID-STATE CIRCUITS, VOL. 37, NO. 10, p. 1302, OCTOBER 2002)).

DISCLOSURE OF INVENTION

Problem to be Solved by the Invention

However, when a master-slave flip-flop with a smaller size and area than the conventional master-slave flip-flop using RAM latches is necessary, it can be implemented only by using a semiconductor process capable of finer fabrication than usual. In this case, the manufacturing cost increases. The same problem also arises in a trigger flip-flop and counter using the master-slave flip-flop.

To reduce the size and area of the master-slave flip-flop, the master latch and slave latch may be implemented by dynamic circuits. However, since a dynamic circuit holds data by charges stored in a capacitance, the held data disappears during the standby time $T_B$ along with removal of the charges. For example, assume that logic "1" corresponds to High level in FIG. 17D. When a standby state is set for logic "1", High level changes to Low level over time so that the logic changes from "1" to "0". This problem also arises even in the operation time $T_A$ if the clock is slow.

The present invention has been made to solve this problem, and has as its object to reduce the size and area of a master-slave flip-flop, and a trigger flip-flop and counter using the master-slave flip-flop.

It is another object of the present invention to prevent disappearance of held data during the standby time even when the size and area of the master-slave flip-flop are reduced.

It is still another object of the present invention to decrease the cost required for size and area reduction of the master-slave flip-flop.

Means of Solution to the Problem

In order to achieve the above-described objects, according to the present invention, there is provided a master-slave flip-flop characterized by comprising: a master latch which writes and holds input data; and a slave latch which is connected to the master latch to write and hold the data held in the master latch complementarily to an operation of the master latch and output the held data, wherein one of the master latch and the slave latch is formed from a static circuit, and the other is formed from a dynamic circuit.

According to the present invention, there is also provide a trigger flip-flop characterized by comprising: a master latch which writes and holds input data; and a slave latch which is connected to the master latch to write and hold the data held in the master latch complementarily to an operation of the master latch and output the held data, wherein the master latch comprises: a first inverter circuit; a second inverter circuit which has an input terminal connected to an output terminal of the first inverter circuit and an output terminal connected to an input terminal of the first inverter circuit; a first transistor of a first conductivity type which has one of input and output terminals connected to the output terminal of the first inverter circuit; a second transistor of the first conductivity type which has one of input and output terminals connected to the other of the input and output terminals of the first transistor; a third transistor of the first conductivity type which has one of input and output terminals connected to the output terminal of the second inverter circuit; a fourth transistor of the first conductivity type which has one of input and output terminals connected to the other of the input and output terminals of the third transistor; and a power supply which is connected to the other of the input and output terminals of each of the second transistor and the fourth transistor, a clock signal is commonly supplied to a control terminal of each of the first transistor and the third transistor, a first input signal is supplied to a control terminal of the second transistor, a second input signal having a polarity opposite to the first input signal supplied to the control terminal of the second transistor is supplied to a control terminal of the fourth transistor, the slave latch comprises: a fifth transistor of a second conductivity type which has one of input and output terminals connected to the output terminal of the first inverter circuit; a seventh transistor of the first conductivity type which has one of input and output terminals connected to the other of the input and output terminals of the fifth transistor; a sixth transistor of the second conductivity type which has one of input and output terminals connected to the output terminal of the second inverter circuit; and an eighth transistor of the first conductivity type which has one of input and output terminals connected to the other of the input and output terminals of the sixth transistor, the clock signal supplied to the control terminal of each of the first transistor and the third transistor is commonly supplied to a control terminal of each of the fifth transistor and the sixth transistor, one of the input and output terminals of the eighth transistor is connected to a control terminal of the seventh transistor, one of the input and output terminals of the seventh transistor is connected to a control terminal of the eighth transistor, the power supply is connected to the other of the input and output terminals of each of the seventh transistor and the eighth transistor, and the control terminal of the second transistor is connected to the other of the input and output terminals of the fifth transistor, and the control terminal of the fourth transistor is connected to the other of the input and output terminals of the sixth transistor.

According to the present invention, there is also provided a counter characterized by comprising: n (n is an integer: $n \geq 2$) trigger flip-flops, each of the trigger flip-flops comprising: a master latch which writes and holds input data; and a slave latch which is connected to the master latch to write and hold the data held in the master latch complementarily to an operation of the master latch and output the held data, wherein the master latch comprises: a first inverter circuit; a second inverter circuit which has an input terminal connected to an output terminal of the first inverter circuit and an output terminal connected to an input terminal of the first inverter circuit; a first transistor of a first conductivity type which has one of input and output terminals connected to the output terminal of the first inverter circuit; a second transistor of the first conductivity type which has one of input and output terminals connected to the other of the input and output terminals of the first transistor; a third transistor of the first conductivity type which has one of input and output terminals connected to the output terminal of the second inverter circuit; a fourth transistor of the first conductivity type which has one of input and output terminals connected to the other of the input and output terminals of the third transistor; and a power supply which is connected to the other of the input and output terminals of each of the second transistor and the fourth transistor, a clock signal is commonly supplied to a control terminal of each of the first transistor and the third transistor, a first input signal is supplied to a control terminal of the second transistor, a second input signal having a polarity opposite to the first input signal supplied to the control terminal of the second transistor is supplied to a control terminal of the fourth transistor, the slave latch comprises: a fifth transistor of a second conductivity type which has one of input and output terminals connected to the output terminal of the first inverter circuit; a seventh transistor of the first conductivity type which has one of input and output terminals connected to the other of the input and output terminals of the fifth transistor; a sixth transistor of the second conductivity type which has one of input and output terminals connected to the output terminal of the second inverter circuit; and an eighth transistor of the first conductivity type which has one of input and output terminals of the sixth transistor, the clock signal supplied to the control terminal of each of the first transistor and the third transistor is commonly supplied to a control terminal of each of the fifth transistor and the sixth transistor, one of the input and output terminals of the eighth transistor is connected to a control terminal of the seventh transistor, one of the input and output terminals of the seventh transistor is connected to a control terminal of the eighth transistor, the power supply is connected to the other of the input and output terminals of each of the seventh transistor and the eighth transistor, the control terminal of the second transistor is connected to the other of the input and output terminals of the fifth transistor, and the control terminal of the fourth transistor is connected to the other of the input and output terminals of the sixth transistor, and a signal from one of one and the other of the input and output terminals of the sixth transistor in a (k−1)th (k is an integer: $2 \leq k \leq n$) trigger flip-flop of a preceding stage is supplied to a kth trigger flip-flop as the clock signal.

Effects of the Invention

In the present invention, one of the master latch and slave latch is formed from a static circuit, and the other is formed from a dynamic circuit. The number of circuit elements can be smaller as compared to a structure in which both latches are formed from static circuits so that the size and area of the master-slave flip-flop, trigger flip-flop, and counter can be reduced.

When the latch formed from a static circuit is set in a data holding state during the standby time, data can be held stably during the standby time.

The size and area of the master-slave flip-flop, and the like can be reduced without using a semiconductor process capable of finer fabrication. Hence, the cost required for size and area reduction can be decreased.

BRIEF DESCRIPTION OF DRAWINGS

FIG. 1 is a circuit diagram showing the first structure example of a master-slave flip-flop according to the present invention;

FIG. 2 is a circuit diagram showing the second structure example of a master-slave flip-flop according to the present invention;

FIG. 3 is a circuit diagram showing the third structure example of a master-slave flip-flop according to the present invention;

FIG. 4 is a circuit diagram showing the fourth structure example of a master-slave flip-flop according to the present invention;

FIGS. 14A to 14D are timing charts for explaining the operation of the counter shown in FIG. 13;

BEST MODE FOR CARRYING OUT THE INVENTION

Figure 5:
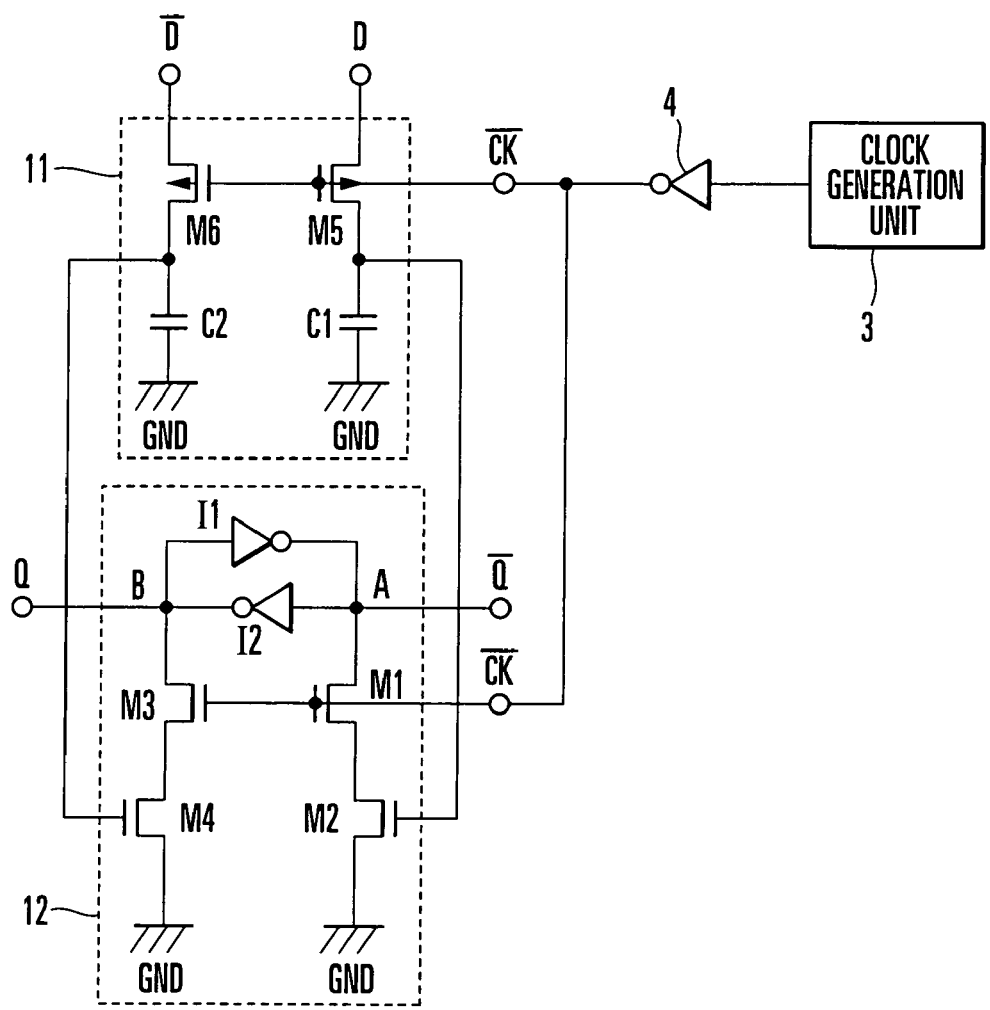
FIG. 5 is a circuit diagram showing the fifth structure example of a master-slave flip-flop according to the present invention.

The embodiment of the present invention will be described below in detail with reference to the accompanying drawings.

1. Master-Slave Flip-Flop

FIRST STRUCTURE EXAMPLE

FIG. 1 is a circuit diagram showing the first structure example of a master-slave flip-flop according to the present invention.

The master-slave flip-flop has a master latch 1 and a slave latch 2. The master latch 1 writes and holds input data and also outputs the data held in it to the slave latch 2. The slave latch 2 writes and holds data received from the master latch 1 and also outputs the data held in the slave latch 2. The master latch 1 and slave latch 2 complementarily execute the write and holding operations.

In this structure example, the master latch 1 is formed from a static circuit, and the slave latch 2 is formed from a dynamic circuit.

The dynamic circuit here indicates a circuit which operates by using charge/discharge in/from a capacitance. In this embodiment, the dynamic circuit which operates as a latch writes data by charging/discharging a capacitance and holds the data by holding the charges stored in the capacitance.

The static circuit indicates a circuit whose operation is determined by the level of an applied DC or pulse voltage without using charge/discharge in/from a capacitance. More specifically, the static circuit is formed from a switching circuit by, e.g., connecting the inputs and outputs of two inverter circuits to each other, as will be described later.

The master latch 1 includes two inverter circuits I1 and I2 and four NMOS transistors M1 to M4. The output terminal of the inverter circuit I1 and the input terminal of the inverter circuit I2 are connected at a connection point A. The output terminal of the inverter circuit I2 and the input terminal of the inverter circuit I1 are connected at a connection point B. The drain (one of the input and output terminals) of the NMOS transistor M1 is connected to the connection point A. The drain of the NMOS transistor M2 is connected to the source (the other of the input and output terminals) of the NMOS transistor M1. The source of the NMOS transistor M2 is connected to ground GND (to be referred to as "grounded" hereinafter). The drain of the NMOS transistor M3 is connected to the connection point B. The drain of the NMOS transistor M4 is connected to the source of the NMOS transistor M3. The source of the NMOS transistor M4 is grounded.

The gate (control terminal) of the NMOS transistor M2 serves as a first data input terminal D of the master latch 1, to which a first input signal is supplied. The gate of the NMOS transistor M4 serves as a second data input terminal /D of the master latch 1, to which a second input signal with a polarity reverse to the first input signal is supplied. The gates of the NMOS transistors M1 and M3 serve as a clock signal input terminal CK of the master latch 1, to which a common clock signal is supplied from a clock generation circuit 3. Hence, the NMOS transistors M1 and M3 function as the data write switch of the master latch 1.

The slave latch 2 includes two PMOS transistors M5 and M6 and two capacitive elements C1 and C2. The source of the PMOS transistor M5 is connected to the connection point A of the master latch 1. One terminal of the capacitive element C1 is connected to the drain of the PMOS transistor M5. The other terminal of the capacitive element C1 is grounded. The source of the PMOS transistor M6 is connected to the connection point B of the master latch 1. One terminal of the capacitive element C2 is connected to the drain of the PMOS transistor M6. The other terminal of the capacitive element C2 is grounded.

The drain of the PMOS transistor M6 serves as a first output terminal Q of the slave latch 2. The drain of the PMOS transistor M5 serves as a second output terminal /Q of the slave latch 2. The gates of the PMOS transistors M5 and M6 serve as the clock signal input terminal CK of the slave latch 2. The NMOS transistors and PMOS transistors operate complementarily. Hence, when a clock signal common to the gates of the NMOS transistors M1 and M3 is supplied from the clock generation circuit 3 to the gates of the PMOS transistors M5 and M6, the PMOS transistors M5 and M6 function as the data write switch of the slave latch 2. As described above, when transistors with a conductivity different from the data write switch of the master latch 1 are used as the data write switch of the slave latch 2, no inverted signal of the clock signal is necessary.

The operation of the master-slave flip-flop will be described.

When the clock signal input terminal CK changes to High level, the master latch 1 is set in the data write enable state, and the slave latch 2 is set in the data holding state. When the data input terminal D is at High level (the data input terminal /D is at Low level), the connection points A and B in the master latch 1 are set to Low level and High level, respectively. When the data input terminal D is at Low level (the data input terminal /D is at High level), the operation reverses. In this way, data is written in the master latch 1.

After that, when the clock signal input terminal CK changes to Low level, the master latch 1 is set in data holding state, and the slave latch 2 is set in the data write enable state. At this time, the potentials of the connection points A and B of the master latch 1 are held and charge/discharge the capacitive elements C1 and C2 through the PMOS transistors M5 and M6, respectively. Hence, data is written in the slave latch 2.

When the clock signal input terminal CK returns to High level, the master latch 1 is set in the data write enable state again, and the slave latch 2 is set in the data holding state. The data held in the slave latch 2 is output from the output terminals Q and /Q.

Charges held in the capacitive elements C1 and C2 of the slave latch 2 gradually disappear over time. However, its influence is totally negligible in the normal operation. The master latch 1 is formed from a static circuit. When the clock signal input terminal CK is set to Low level to maintain the data holding state of the master latch 1 during the standby time, the data can be held stably. The data held in the master latch 1 in the standby time is transferred to the slave latch 2 at the time of resuming the operation. Then, the operation is executed without any problem. The states of the master latch 1 and slave latch 2 are set by the clock signal from the clock generation circuit 3. Hence, the clock generation circuit 3 functions as a state setting unit.

In this master-slave flip-flop, the slave latch 2 is formed from a dynamic circuit. Hence, the number of circuit elements can be smaller as compared to the prior art wherein the slave latch 102 is formed from a static circuit. In addition, since no inverted signal of the clock signal is necessary, as described above, the size and area of the master-slave flip-flop can be reduced. More specifically, the layout area of the master-slave flip-flop can be reduced by about 30% as compared to the above-described prior art.

In this structure example, the sources of the NMOS transistors M2 and M4 and the other terminal of each of the capacitive elements C1 and C2 are grounded. However, they may be connected to a constant voltage source. This also applies to various structure examples to be described later.

SECOND STRUCTURE EXAMPLE

FIG. 2 is a circuit diagram showing the second structure example of a master-slave flip-flop according to the present invention. The same reference numerals as in FIG. 1 denote the same or similar constituent elements in FIG. 2.

The second structure example is different from the first structure example in the structure of the dynamic circuit of the slave latch. A slave latch 2A of this structure example comprises NMOS transistors M7 and M8 in place of the capacitive elements C1 and C2 of the slave latch 2.

The NMOS transistors M7 and M8 are cross-connected. More specifically, in the NMOS transistor M7, the drain is connected to the second output terminal /Q of the slave latch 2A, the source is grounded, and the gate is connected to the first output terminal Q of the slave latch 2A. In the NMOS transistor M8, the drain is connected to the output terminal Q, the source is grounded, and the gate is connected to the output terminal /Q.

In this structure, the output terminal Q or /Q of High level turns on the NMOS transistor connected to the output terminal /Q or Q on the opposite side. Low level can properly be set in the output terminal /Q or Q on the opposite side, and the holding characteristic in the latch operation can be improved. Hence, the size and area can be reduced as compared to the conventional master-slave flip-flop while improving the data holding characteristic as compared to the first structure example.

THIRD STRUCTURE EXAMPLE

FIG. 3 is a circuit diagram showing the third structure example of a master-slave flip-flop according to the present invention. The same reference numerals as in FIGS. 1 and 2 denote the same or similar constituent elements in FIG. 3.

The third structure example is different from the second structure example in the structure of the dynamic circuit of the slave latch. A slave latch 2B of this structure example is formed by adding capacitive elements C3 and C4 to the slave latch 2A.

One terminal of the capacitive element C3 is connected to the gate of the NMOS transistor M7, and the other terminal is grounded. One terminal of the capacitive element C4 is connected to the gate of the NMOS transistor M8, and the other terminal is grounded.

In this structure, the data holding characteristic can be improved, as in the second structure example, while making the capacitive elements C3 and C4 hold data held in the slave latch 2B. Hence, the size and area can be reduced as compared to the conventional master-slave flip-flop while further improving the data holding characteristic as compared to the second structure example.

FOURTH STRUCTURE EXAMPLE

FIG. 4 is a circuit diagram showing the fourth structure example of a master-slave flip-flop according to the present invention. The same reference numerals as in FIGS. 1 to 3 denote the same or similar constituent elements in FIG. 4.

The fourth structure example is different from the third structure example in the structure of the dynamic circuit of the slave latch. In a slave latch 2C of this structure example, the capacitive elements C3 and C4 are implemented by gate capacitances (gate-to-source capacitances) $Cg7a$ and $Cg8a$ as the input capacitances of NMOS transistors M7a and M8a, respectively.

More specifically, when the gate widths or gate lengths of the NMOS transistors M7a and M8a are increased, the gate capacitances of the NMOS transistors M7a and M8a can be increased. Consequently, the same effect as in the third structure example can be obtained without increasing the number of circuit elements.

In this structure, the number of circuit elements can further be reduced while obtaining the data holding characteristic of the third structure example. Hence, the size and area can be reduced as compared to the conventional master-slave flip-flop.

FIFTH STRUCTURE EXAMPLE

In the above-described examples, the master latch 1 of the master-slave flip-flop is formed from a static circuit, and the slave latch 2 is formed from a dynamic circuit. Conversely, a master latch 11 may be formed from a dynamic circuit, and a slave latch 12 may be formed from a static circuit, as shown in FIG. 5.

The master latch 11 includes the two PMOS transistors M5 and M6 and the two capacitive elements C1 and C2, like the slave latch 2 of the first structure example. However, the master latch 11 is different from the slave latch 2 in that the sources of the PMOS transistors M5 and M6 serve as the first and second data input terminals D and /D of the master latch 1, respectively, and the drains of the PMOS transistors M5 and M6 are connected to the slave latch 12.

The slave latch 12 includes the two inverter circuits I1 and I2 and the four NMOS transistors M1 to M4, like the master latch 1 of the first structure example. However, the slave latch 12 is different from the master latch 1 in that the gates of the NMOS transistors M2 and M4 are connected to the drains of the PMOS transistors M5 and M6 of the master latch 11, and the connection points B and A to the inverter circuits I1 and I2 serve as the first and second output terminal Q and /Q of the slave latch 12, respectively.

The gates of the NMOS transistors M1 and M3 and PMOS transistors M5 and M6 serve as the clock signal input terminal /CK to which a signal in a phase opposite to the clock signal from the clock generation circuit 3 must be input. In FIG. 5, an inverter 4 is connected between the clock generation circuit 3 and the clock signal input terminal /CK.

In this structure example, the clock signal input terminal /CK is set to Low level during the standby time of the flip-flop to make the slave latch 12 maintain the data holding state, thereby stably holding data.

2. Trigger Flip-Flop (TFF)

FIRST STRUCTURE EXAMPLE

Figure 6:
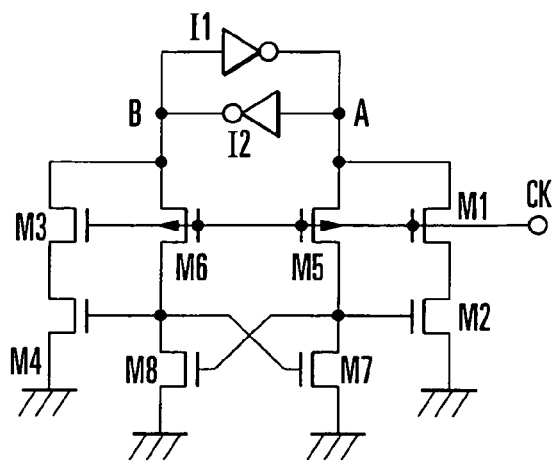
FIG. 6 is a circuit diagram showing the first structure example of a trigger flip-flop according to the present invention.

FIG. 6 is a circuit diagram showing the first structure example of a trigger flip-flop according to the present invention. The same reference numerals as in FIGS. 1 and 2 denote the same or similar constituent elements in FIG. 6.

This trigger flip-flop is formed on the basis of the second structure example of the master-slave flip-flop shown in FIG. 2. More specifically, the second output terminal /Q of the slave latch 2A is connected to the first input terminal D of the master latch 1. The first output terminal Q of the slave latch 2A is connected to the second input terminal /D of the master latch 1.

Since the trigger flip-flop can be formed by simple connection, as shown in FIG. 6, an effect of reducing the layout area by interconnections can be obtained in addition to the effect of reducing the size and area of the master-slave flip-flop according to the present invention. Hence, the size and area of the trigger flip-flop can be reduced as compared to a conventional trigger flip-flop using a master-slave flip-flop.

This structure example uses the second structure example of the master-slave flip-flop. However, the trigger flip-flop can be implemented by using any one of the above-described first to fourth structure examples of the master-slave flip-flop.

SECOND STRUCTURE EXAMPLE

Figure 7:
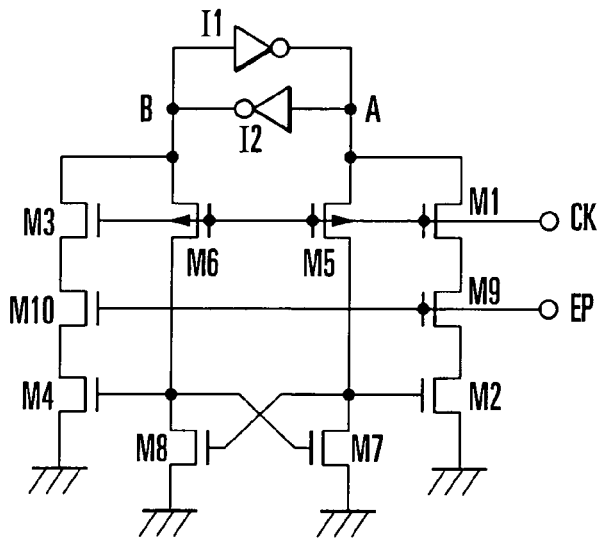
FIG. 7 is a circuit diagram showing the second structure example of a trigger flip-flop according to the present invention.

FIG. 7 is a circuit diagram showing the second structure example of a trigger flip-flop according to the present invention. The same reference numerals as in FIGS. 1, 2, and 6 denote the same or similar constituent elements in FIG. 7. The second structure example is different from the first structure example in that NMOS transistors M9 and M10 to enable the write in the master latch 1 are added to supply a write enabling signal.

The NMOS transistor M9 is inserted in series between the NMOS transistors M1 and M2. More specifically, the drain of the NMOS transistor M9 is connected to the source of the NMOS transistor M1, and the source of the NMOS transistor M9 is connected to the drain of the NMOS transistor M2.

Similarly, the NMOS transistor M10 is inserted in series between the NMOS transistors M3 and M4. More specifically, the drain of the NMOS transistor M10 is connected to the source of the NMOS transistor M3, and the source of the NMOS transistor M10 is connected to the drain of the NMOS transistor M4.

The gates of the NMOS transistors M9 and M10 serve as a write enabling signal input terminal EP to which a common write enabling signal is supplied.

When the write enabling signal is at Low level, the NMOS transistors M9 and M10 are in an OFF state so data in the slave latch 2A is not written in the master latch 1. Hence, when the write enabling signal is set to Low level during the standby time, the data in the master latch 1 can held stably independently of the polarity of the clock signal.

Figure 8:
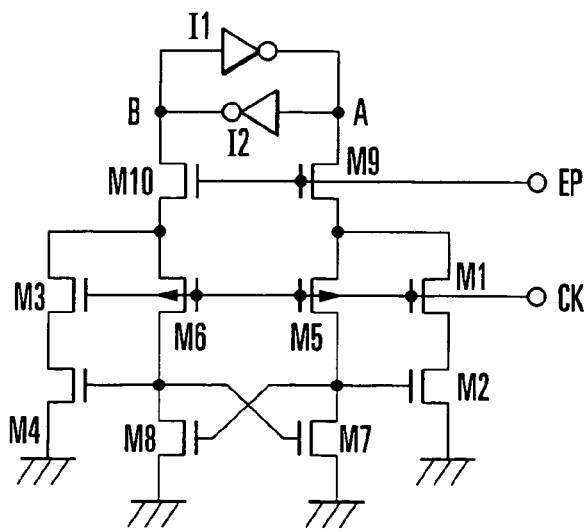
FIG. 8 is a circuit diagram showing the third structure example of a trigger flip-flop according to the present invention.

As shown in FIG. 8, the NMOS transistor M9 may be inserted between the connection point A of the two inverter circuits I1 and I2 and the drain of the NMOS transistor M1, and the NMOS transistor M10 may be inserted between the connection point B of the two inverter circuits I1 and I2 and the drain of the NMOS transistor M3.

This structure example uses the second structure example of the master-slave flip-flop. However, the trigger flip-flop can be implemented by using any one of the above-described first to fourth structure examples of the master-slave flip-flop.

3. Counter

FIRST STRUCTURE EXAMPLE

Figure 9:
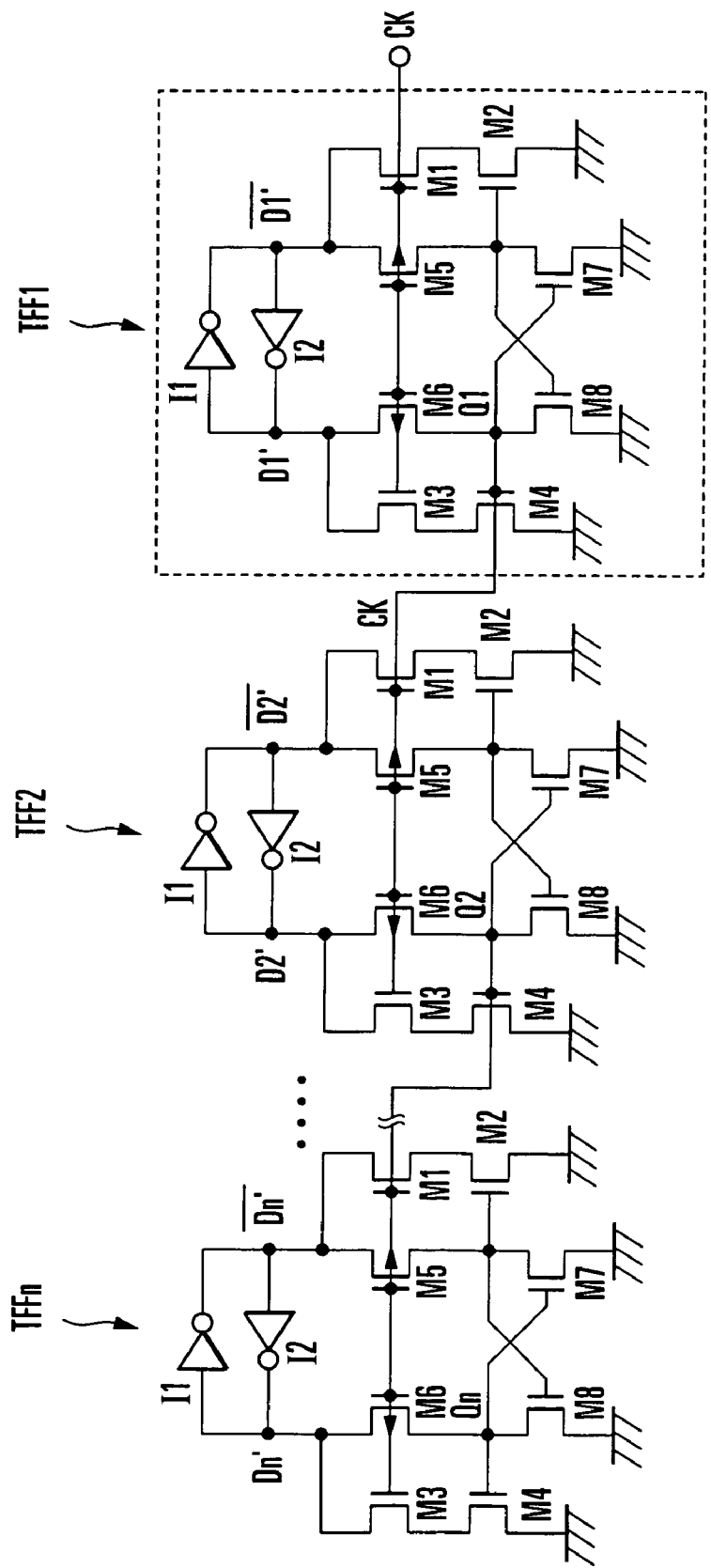
FIG. 9 is a circuit diagram showing the first structure example of a counter according to the present invention.

FIG. 9 is a circuit diagram showing the first structure example of a counter according to the present invention. The same reference numerals as in FIGS. 1, 2, and 6 denote the same or similar constituent elements in FIG. 9.

The counter is formed by connecting n stages of trigger flip-flops shown in FIG. 6 (n is an integer: $n \geq 2$). More specifically, the output terminal Q of a trigger flip-flop TFFk−1 of the (k−1)th stage (k is an integer: $2 \leq k \leq n$) is connected to the clock signal input terminal CK of a trigger flip-flop TFFk of the next kth stage. That is, the output signal from the (k−1)th stage is supplied as the clock signal to the kth stage.

In this counter, clock signal supply to the trigger flip-flop of the next stage can be implemented by one interconnection. For this reason, an effect of reducing the layout area by interconnections can be obtained in addition to the effect of reducing the size and area of the master-slave flip-flop according to the present invention used in the trigger flip-flop. Hence, the size and area of the counter can be reduced as compared to a conventional counter using a master-slave flip-flop.

This structure example uses the second structure example of the master-slave flip-flop. However, the counter can be implemented by using any one of the above-described first to fourth structure examples of the master-slave flip-flop.

SECOND STRUCTURE EXAMPLE

Figure 10:
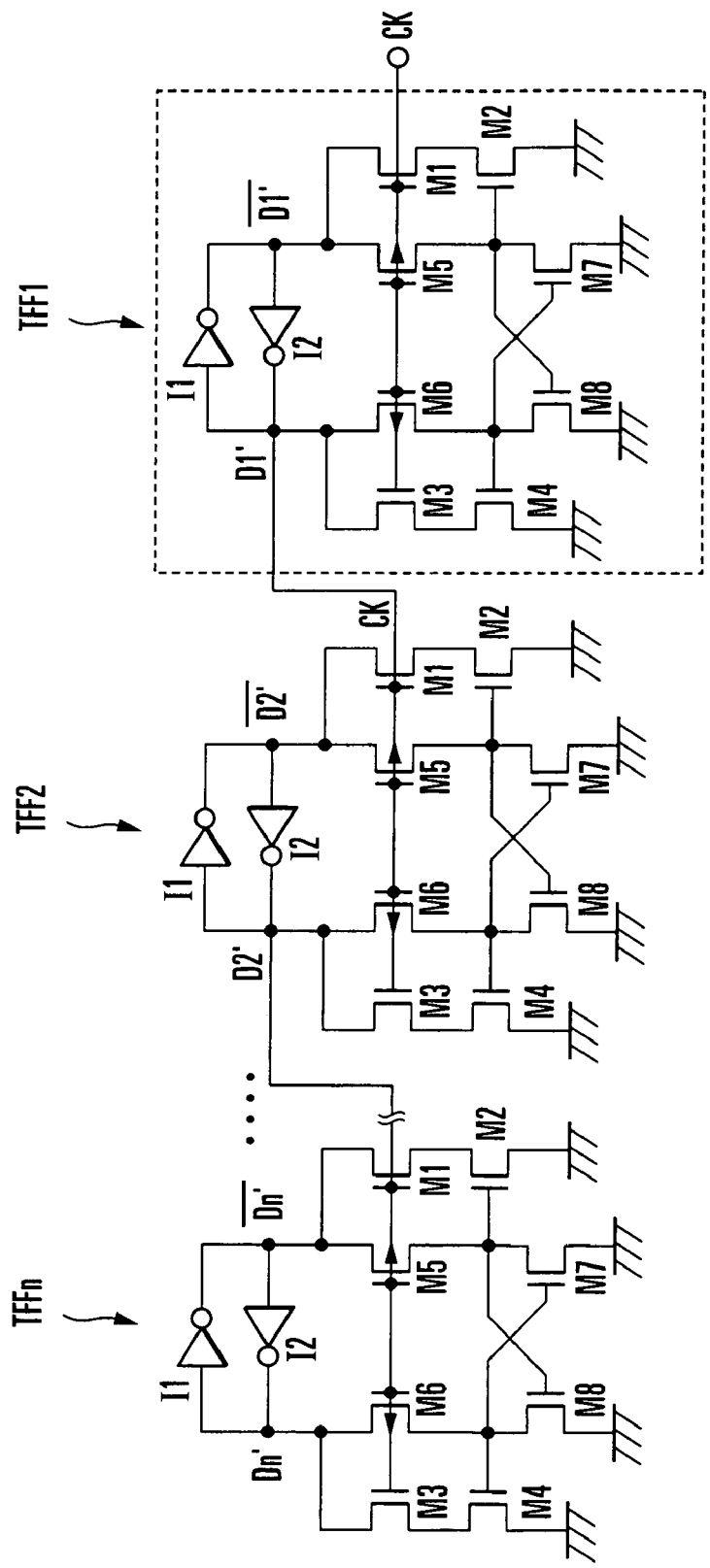
FIG. 10 is a circuit diagram showing the second structure example of a counter according to the present invention.
Figure 11A:
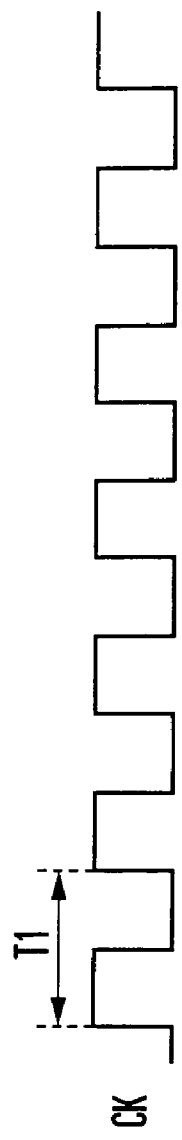
FIGS. 11A to 11D are timing charts for explaining the operation of the counter shown in FIG. 10.
Figure 11B:
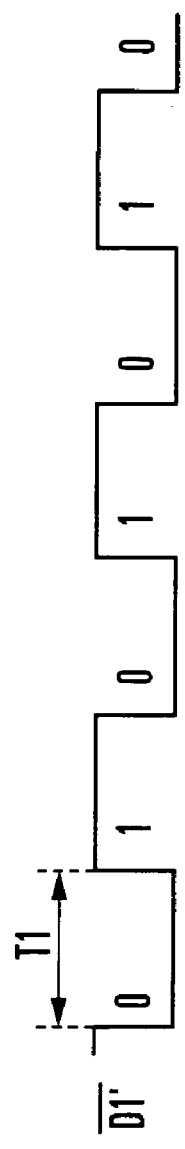
Figure 11C:
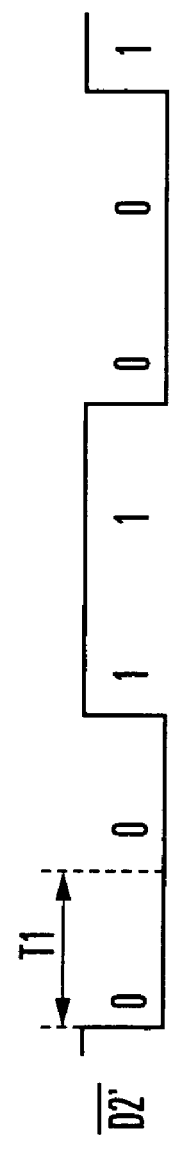
Figure 11D:
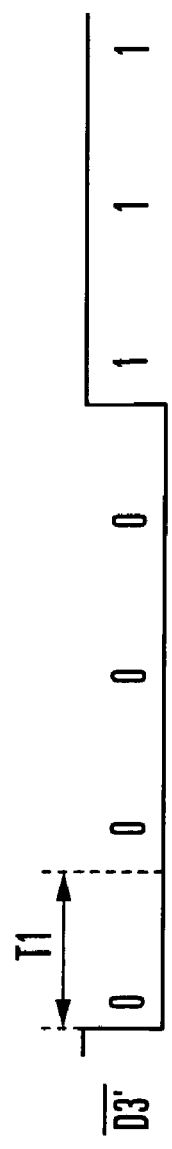

FIG. 10 is a circuit diagram showing the second structure example of a counter according to the present invention. The same reference numerals as in FIGS. 1, 2, 6, and 9 denote the same or similar constituent elements in FIG. 10.

Unlike the first structure example, an internal terminal Dk' of the master latch 1 of the trigger flip-flop TFFk−1 of the (k−1)th stage is connected to the clock signal input terminal CK of the trigger flip-flop TFFk of the next kth stage. The internal terminal Dk' corresponds to the connection point B between the output terminal of the inverter circuit I2 and the input terminal of the inverter circuit I1. Hence, the output signal from the inverter circuit I2 of the master latch 1 of the (k−1)th stage is supplied as the clock signal to the kth stage.

In this structure, the clock signal of the next stage is driven by the inverter circuit I2 of the master latch 1 as a static circuit. For this reason, the potential of the clock signal input terminal CK of the next stage can be controlled stably, and a reliable write operation can be realized.

FIGS. 11A to 11D are timing charts for explaining the operation of the counter shown in FIG. 10.

In this counter, counter outputs are extracted from internal terminals /D1' to /Dn' of the master latches 1 of the trigger flip-flops of the respective stages. The internal terminals /D1' to /Dn' will be referred to as "counter output terminals" hereinafter. Each of the internal terminals /D1' to /Dn' corresponds to the connection point A between the output terminal of the inverter circuit I1 and the input terminal of the inverter circuit I2 in the master latch 1.

Referring to FIGS. 11A to 11D, during a period T1, all the output terminals /D1' to /Dn' output Low level corresponding to "0". When the clock signal CK changes, and the period T1 elapses, the output from the output terminal /D1' of the first stage changes from Low level to High level, and the count value is incremented by one. When the clock signal CK further changes, and the period T1 elapses, the output from the output terminal /D1' of the first stage returns from High level to Low level. As a result, the output from the output terminal /D2' of the second stage changes from Low level to High level, and the count value is incremented by one. The count operation can be implemented by repeating this operation.

This structure example uses the second structure example of the master-slave flip-flop. However, the counter can be implemented by using any one of the above-described first to fourth structure examples of the master-slave flip-flop.

THIRD STRUCTURE EXAMPLE

Figure 12:
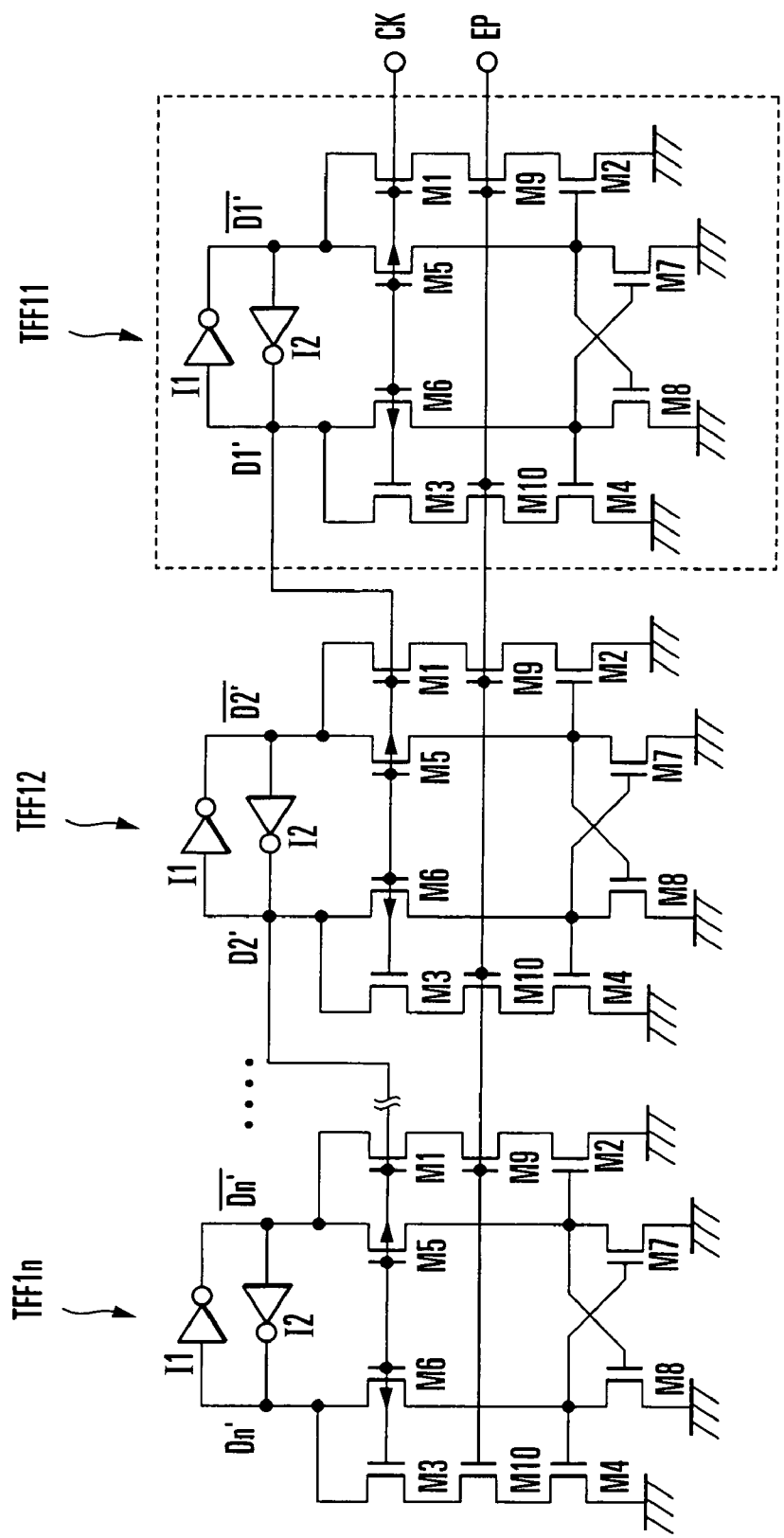
FIG. 12 is a circuit diagram showing the third structure example of a counter according to the present invention.

FIG. 12 is a circuit diagram showing the third structure example of a counter according to the present invention. The same reference numerals as in FIGS. 1, 2, 7, and 9 denote the same or similar constituent elements in FIG. 12. The third structure example is different from the second structure example in that the counter is formed by connecting n stages of trigger flip-flops shown in FIG. 7.

In this counter, the write enabling signal input terminals EP of the trigger flip-flops of the respective stages are commonly connected to supply a common write enabling signal.

When the write enabling signal is at Low level, the NMOS transistors M9 and M10 are in an OFF state so data in the slave latch 2A is not written in the master latch 1. Hence, when the write enabling signal is set to Low level during the standby time, the data in the master latch 1 can be held stably independently of the polarity of the clock signal.

This structure example uses the second structure example of the master-slave flip-flop. However, the counter can be implemented by using any one of the above-described first to fourth structure examples of the master-slave flip-flop.

In this structure example, the internal terminal Dk' of the master latch 1 of the trigger flip-flop shown in FIG. 7 is connected to the clock signal input terminal CK of the next stage, as in the second structure example shown in FIG. 10. However, the output terminal Q of the trigger flip-flop shown in FIG. 7 is connected to the clock signal input terminal CK of the next stage, and the write enabling signal input terminals EP of the respective stages may be commonly connected, as in the first structure example shown in FIG. 9. An illustration of it can easily be estimated from FIGS. 9 and 12 and will be omitted.

FOURTH STRUCTURE EXAMPLE

Figure 13:
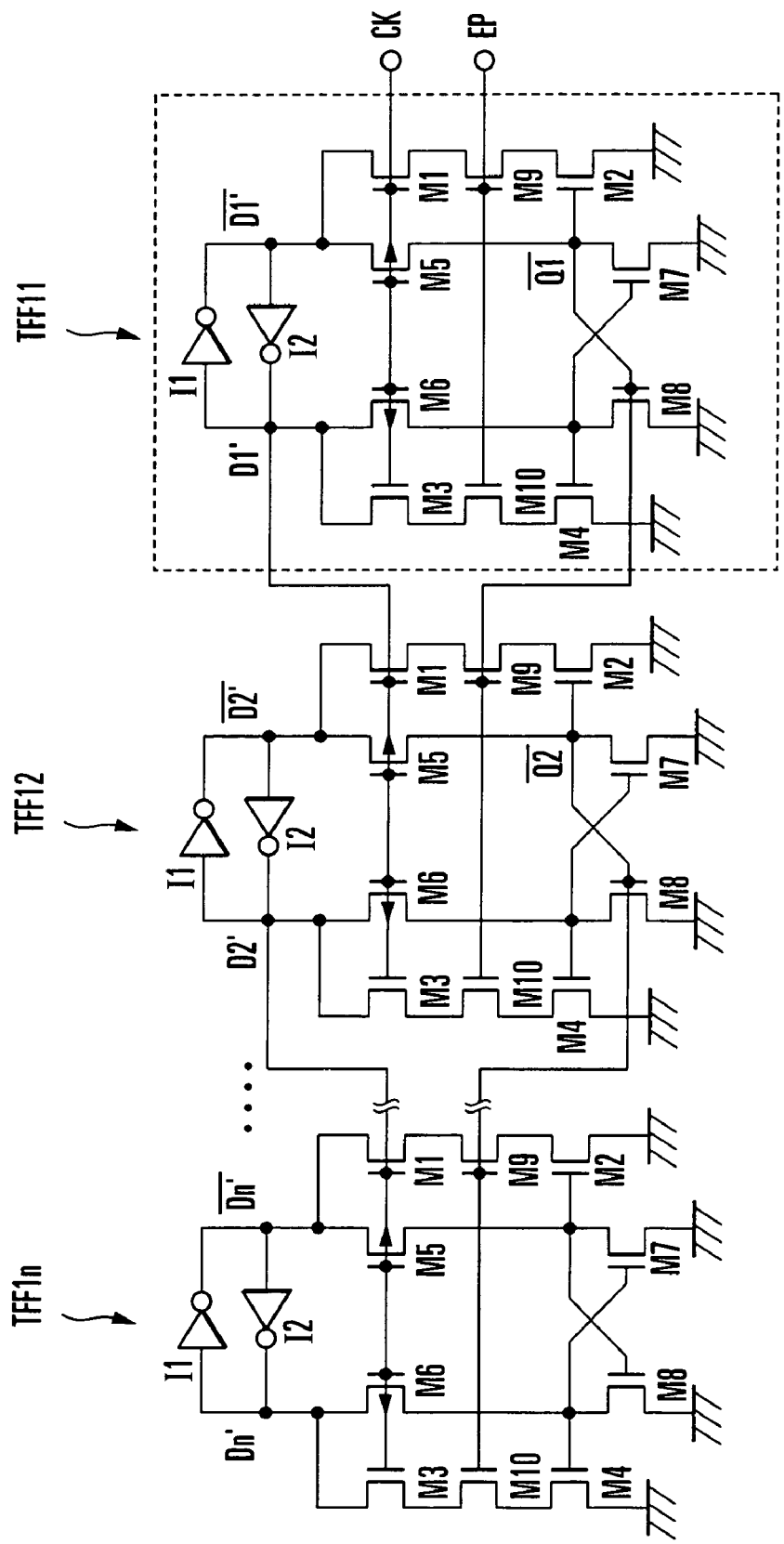
FIG. 13 is a circuit diagram showing the fourth structure example of a counter according to the present invention.
Figure 15:
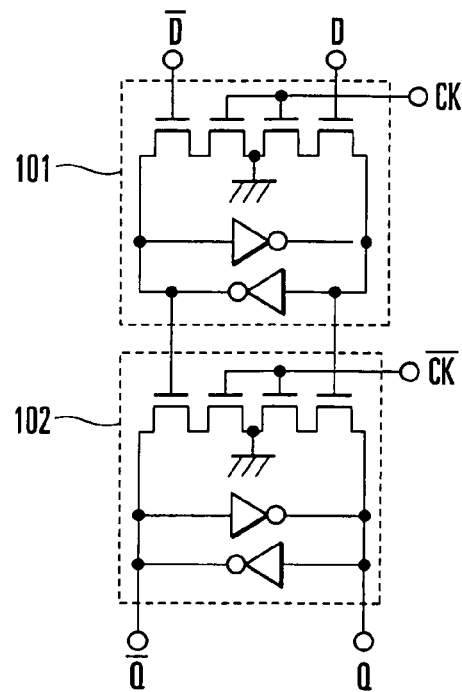
FIG. 15 is a circuit diagram showing a structure example of a conventional master-slave flip-flop.
Figure 16:
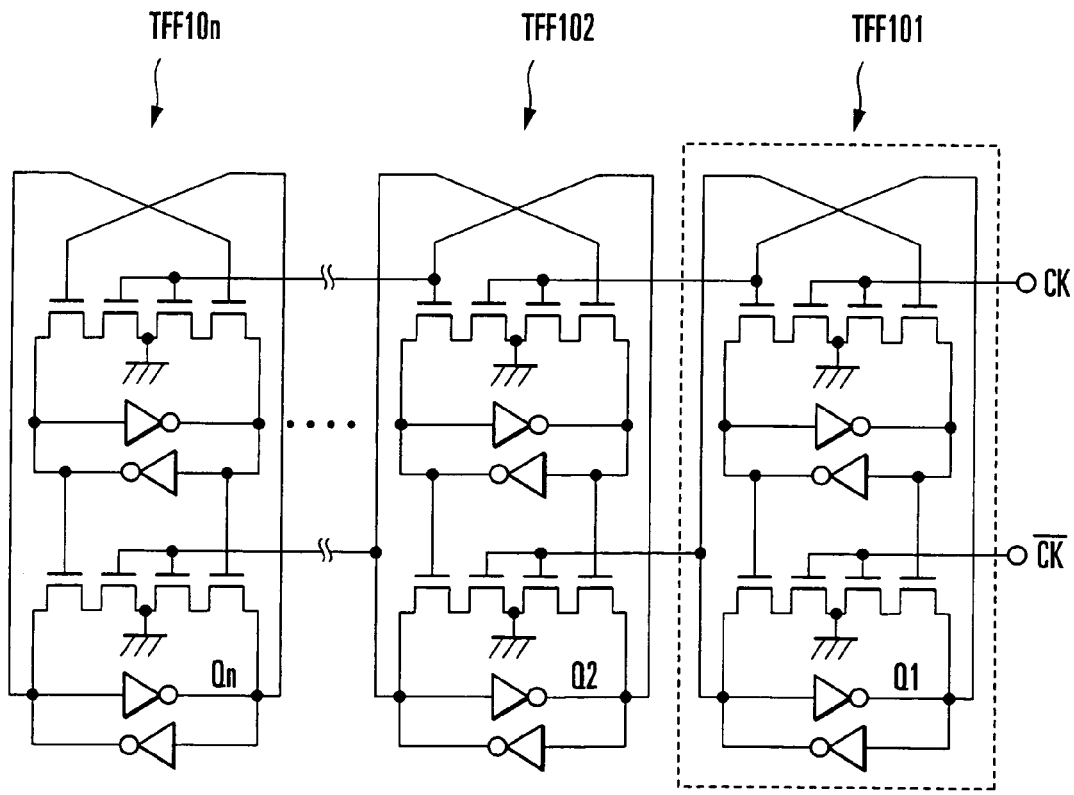
FIG. 16 is a circuit diagram showing the structure of a conventional trigger flip-flop and counter using the conventional master-slave flip-flop.
Figure 17A:
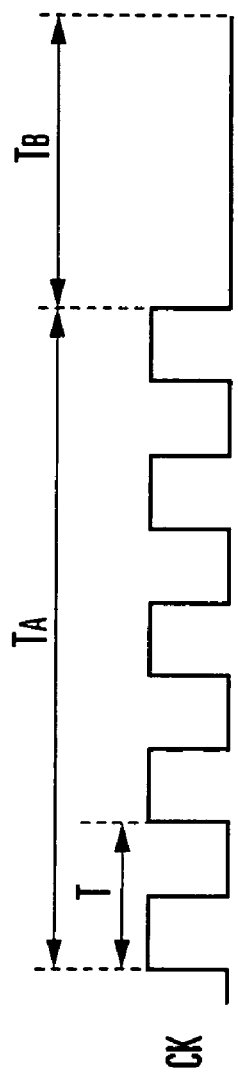
FIGS. 17A to 17D are timing charts for explaining the operation of the conventional counter.
Figure 17B:
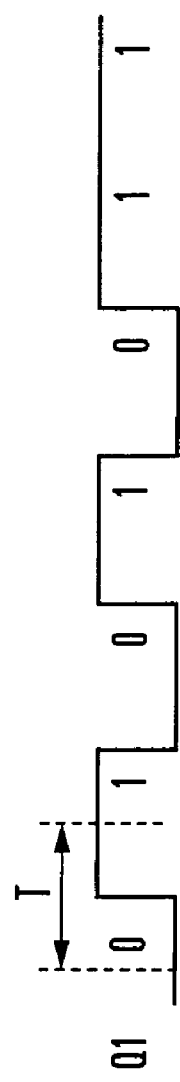
Figure 17C:
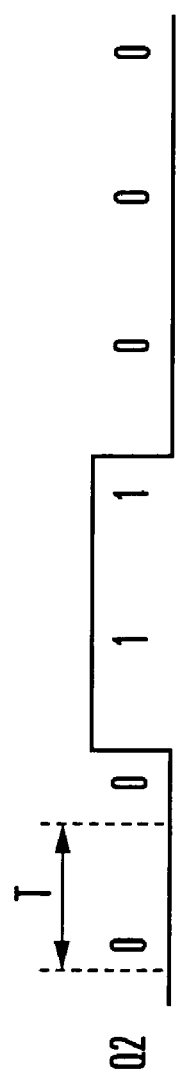
Figure 17D:
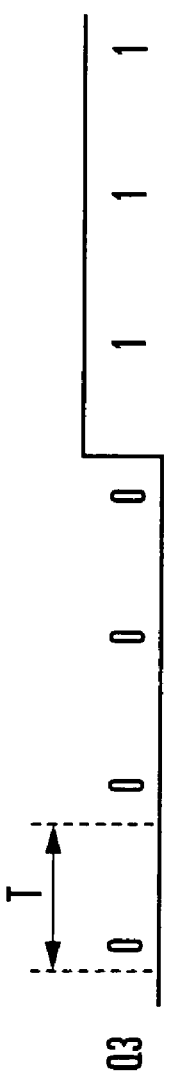

FIG. 13 is a circuit diagram showing the fourth structure example of a counter according to the present invention. The same reference numerals as in FIGS. 1, 2, 7, and 9 denote the same or similar constituent elements in FIG. 13.

The fourth structure example is different from the third structure example in that the write enabling signal input terminals EP of the respective stages are not commonly connected. More specifically, in this counter, the second output terminal /Q of the slave latch 2A of the trigger flip-flop of the (k−1)th stage is connected to the write enabling signal input terminal EP of the trigger flip-flop of the next kth stage. Hence, the output signal from the output terminal /Q of the slave latch 2A of the (k−1)th stage is supplied as a write enabling signal of the kth stage.

In this structure, since the write enabling signal of the trigger flip-flop from the second stage is controlled by the output terminal /Q of the slave latch 2A of the preceding stage, write operation control to the master latch 1 synchronizes with the operation of the trigger flip-flop of the preceding stage. Hence, a reliable data write operation can be implemented during the operation.

FIGS. 14A to 14D are timing charts for explaining the operation of the counter shown in FIG. 13. The basic operation is the same as that shown in FIGS. 11A to 11D.

An emphasis is placed on the write operation in the second stage (TFF12). During only a period T2 when the output terminal /D1' of the first stage (TFF11) is at Low level, and an output terminal /Q1 of the first stage (TFF11) is at High level, the write operation in the second stage (TFF12) is enabled, and the signal level of the output terminal /D2' of the second stage (TFF12) can change. During other periods, no write in the second stage (TFF12) is executed so that a reliable write operation is performed.

The write period T2 is ½ as compared to the second structure example shown in FIG. 10. Especially when the clock period is long, or the counter includes multiple stages, the count value can be held stably by halving the write period T2 during the operation.

This structure example uses the second structure example of the master-slave flip-flop. However, the counter can be implemented by using any one of the above-described first to fourth structure examples of the master-slave flip-flop.

In the above-described structure examples, a PMOS transistor may be used in place of an NMOS transistor, or an NMOS transistor may be used in place of a PMOS transistor.

As described above, according to the present invention, the size and area of the master-slave flip-flop, trigger flip-flop, and counter capable of stably holding data during the standby time can be reduced without using a semiconductor process capable of finer fabrication than usual. Hence, an increase in manufacturing cost required for size and area reduction can be suppressed.

When the master-slave flip-flop, trigger flip-flop, and counter according to the present invention are manufactured by using a semiconductor process capable of finer fabrication than usual, the size and area can further be reduced.

The invention claimed is:

1. A counter characterized by comprising:
   n (n is an integer: n≧2) trigger flip-flops,
   each of said trigger flip-flops comprising:
   a master latch which writes and holds input data; and
   a slave latch which is connected to said master latch to write and hold the data held in said master latch complementarily to an operation of said master latch and output the held data, wherein said master latch comprises:
a first inverter circuit;
a second inverter circuit which has an input terminal connected to an output terminal of said first inverter circuit and an output terminal connected to an input terminal of said first inverter circuit;
a first transistor of a first conductivity type which has one of input and output terminals connected to the output terminal of said first inverter circuit;
a second transistor of the first conductivity type which has one of input and output terminals connected to the other of the input and output terminals of said first transistor;
a third transistor of the first conductivity type which has one of input and output terminals connected to the output terminal of said second inverter circuit;
a fourth transistor of the first conductivity type which has one of input and output terminals connected to the other of the input and output terminals of said third transistor; and
a power supply which is connected to the other of the input and output terminals of each of said second transistor and said fourth transistor,
a clock signal is commonly supplied to a control terminal of each of said first transistor and said third transistor,
a first input signal is supplied to a control terminal of said second transistor,
a second input signal having a polarity opposite to the first input signal supplied to the control terminal of said second transistor is supplied to a control terminal of said fourth transistor,
said slave latch comprises:
a fifth transistor of a second conductivity type which has one of input and output terminals connected to the output terminal of said first inverter circuit;
a seventh transistor of the first conductivity type which has one of input and output terminals connected to the other of the input and output terminals of said fifth transistor;
a sixth transistor of the second conductivity type which has one of input and output terminals connected to the output terminal of said second inverter circuit; and
an eighth transistor of the first conductivity type which has one of input and output terminals connected to the other of the input and output terminals of said sixth transistor,
the clock signal supplied to the control terminal of each of said first transistor and said third transistor is commonly supplied to a control terminal of each of said fifth transistor and said sixth transistor,
said one of the input and output terminals of said eighth transistor is connected to a control terminal of said seventh transistor,
said one of the input and output terminals of said seventh transistor is connected to a control terminal of said eighth transistor,
said power supply is connected to the other of the input and output terminals of each of said seventh transistor and said eighth transistor,
the control terminal of said second transistor is connected to said other of the input and output terminals of said fifth transistor, and the control terminal of said fourth transistor is connected to said other of the input and output terminals of said sixth transistor, and
a signal from one of said one and said other of the input and output terminals of said sixth transistor in a (k−1)th (k is an integer: 2≦k≦n) trigger flip-flop of a preceding stage is supplied to a kth trigger flip-flop as the clock signal.

2. A counter according to claim 1, characterized in that each of said trigger flip-flops comprises:
a ninth transistor of the first conductivity type which is inserted between said first transistor and said second transistor, has one of input and output terminals connected to said other of the input and output terminals of said first transistor, and has the other of the input and output terminals connected to said one of the input and output terminals of said second transistor; and
a 10th transistor of the first conductivity type which is inserted between said third transistor and said fourth transistor, has one of input and output terminals connected to said other of the input and output terminals of said third transistor, and has the other of the input and output terminals connected to said one of the input and output terminals of said fourth transistor,
wherein in all of said n trigger flip-flops, a write enabling signal to enable a data write is supplied to a control terminal of each of said ninth transistor and said 10th transistor.

3. A counter according to claim 1, characterized in that each of said trigger flip-flops comprises:
a ninth transistor of the first conductivity type which is inserted between said first transistor and said second transistor, has one of input and output terminals connected to said other of the input and output terminals of said first transistor, and has the other of the input and output terminals connected to said one of the input and output terminals of said second transistor; and
a 10th transistor of the first conductivity type which is inserted between said third transistor and said fourth transistor, has one of input and output terminals connected to said other of the input and output terminals of said third transistor, and has the other of the input and output terminals connected to said one of the input and output terminals of said fourth transistor,
wherein a write enabling signal to enable a data write is supplied to a control terminal of each of said ninth transistor and said 10th transistor, and
a signal from one of the input and output terminals of said sixth transistor in a (k−1)th (k is an integer: 2≦k≦n) trigger flip-flop of a preceding stage is supplied to a kth trigger flip-flop as the clock signal, and a signal from said other of the input and output terminals of said fifth transistor in the (k−1)th trigger flip-flop is supplied to the kth trigger flip-flop as the write enabling signal.

4. A counter according to claim 3, characterized in that each of said first transistor, said second transistor, said third transistor, said fourth transistor, said fifth transistor, said sixth transistor, said seventh transistor, said eighth transistor, said ninth transistor, and said 10th transistor comprises a MOS transistor.

5. A counter according to claim 4, characterized in that each of said first transistor, said second transistor, said third transistor, said fourth transistor, said seventh transistor, said eighth transistor, said ninth transistor, and said 10th transistor comprises an NMOS transistor, and
each of said fifth transistor and said sixth transistor comprises a PMOS transistor.

* * * * *